United States Patent
Sutardja et al.

(10) Patent No.: US 6,903,448 B1
(45) Date of Patent: Jun. 7, 2005

(54) HIGH PERFORMANCE LEADFRAME IN ELECTRONIC PACKAGE

(75) Inventors: Sehat Sutardja, Los Altos Hills, CA (US); Vincent Kao, San Jose, CA (US); Hendrick Santo, Milpitas, CA (US)

(73) Assignee: Marvell International Ltd., Hamilton (BM)

( * ) Notice: Subject to any disclaimer, the term of this patent is extended or adjusted under 35 U.S.C. 154(b) by 29 days.

(21) Appl. No.: 10/392,436

(22) Filed: Mar. 17, 2003

Related U.S. Application Data

(60) Provisional application No. 60/425,792, filed on Nov. 12, 2002.

(51) Int. Cl.[7] .......................................... H01L 23/495
(52) U.S. Cl. ..................... 257/666; 257/784; 257/786; 257/773; 257/787
(58) Field of Search ............................. 257/666, 784, 257/787, 773

(56) References Cited

U.S. PATENT DOCUMENTS

| | | |
|---|---|---|
| 5,140,496 A * | 8/1992 | Heinks et al. ........... 361/306.2 |
| 5,430,250 A | 7/1995 | Kwon |
| 5,473,198 A * | 12/1995 | Hagiya et al. ............... 257/786 |
| 5,543,657 A | 8/1996 | Diffenderfer et al. |
| 5,798,571 A * | 8/1998 | Nakajima ................... 257/784 |
| 6,184,585 B1 | 2/2001 | Martinez et al. |
| 6,246,107 B1 | 6/2001 | Silvestre |
| 6,266,246 B1 | 7/2001 | Crane, Jr. et al. |
| 6,333,549 B2 | 12/2001 | Drehobl et al. |
| 6,335,564 B1 | 1/2002 | Pour |
| 6,563,203 B2 | 5/2003 | Nashimura |
| 6,784,533 B2 * | 8/2004 | Shimizu et al. ............. 257/691 |
| 2002/0145180 A1 | 10/2002 | Terui et al. |

* cited by examiner

Primary Examiner—Jasmine Clark

(57) ABSTRACT

Systems and techniques to provide a high performance leadframe architecture in electronic packages. An electronic package includes an extended area for wire bonding to provide improved high-current operation. The extended area can be an extended portion of a single lead in a single-layer non-leaded leadframe, where multiple wires are connected between multiple bond pads and the single lead. The extended area can be a support bar of a leadframe that is used as bond area for ground connections in a single-layer non-leaded leadframe. The extended area can be lead regions used for wire bonding voltage output and voltage input using a reduced power dissipation topology.

90 Claims, 7 Drawing Sheets

HIGH PERFORMANCE LEADFRAME IN ELECTRONIC PACKAGE

CROSS REFERENCE TO RELATED APPLICATIONS

This application claims the benefit of the priority of U.S. Provisional Application Ser. No. 60/425,792, filed Nov. 12, 2002 and entitled "EXTEND INNER LEAD AREA FOR MULTIPLE WIRE-BONDED POWER AND GROUND PINS FOR THE PURPOSE OF POWER MANAGEMENT".

TECHNICAL FIELD

The present disclosure describes systems and techniques relating to electronic package leadframes, for example, an electronic package leadframe with one or more high current capacity leads used in power management applications.

BACKGROUND

Improvements in semiconductor technology and semiconductor manufacturing processes have resulted in increasingly smaller electronic transistors and highly integrated semiconductor circuits. Typically, a very large number of transistors are integrated into a single multi-function chip. Yet despite continued reduction in the unit transistor power, the power density of unit die area continues to grow rapidly as the demand for high performance and high speed chips increases. This has been particularly true for processors, communication chips and some power chips.

Requiring chips to support high power and high electric current can have significant implications for management of the package structure and interconnection techniques for the electronic packages used to deliver the chips. Typically, a semiconductor circuit package includes a substrate on which the chip is mounted. A conventional form of the substrate is a leadframe, which is frequently made from a copper alloy material, and includes a plane area, or paddle, to support the semiconductor chip. Traditional leadframes include both single layer and multi-layer leadframes. Current high performance leadframes used in semiconductor packaging are typically multi-layer leadframes, and producing these leadframes is generally a complex and expensive process.

Interconnecting the semiconductor chip and the substrate typically involves either solder bumpers or wire bond technology. Wire bond technology is widely used for leadframe-based packages, and a popular material for the wire is pure gold doped with tiny amounts of other doped elements. As chip sizes are reduced, the available bond area and pitch are also made smaller, which may require the use of thinner gold wires as the interconnection media.

SUMMARY

The present disclosure includes systems and techniques relating to leadframe design in electronic packages. According to an aspect, an electronic package can include a single-layer non-leaded leadframe with a plurality of leads electrically isolated from each other and partially exposed at a bottom side of the electronic package providing surface mounting connections. The electronic package further includes a semiconductor chip including bond pads, and wires between the bond pads and the plurality of leads, including at least two wires between at least two of the bond pads and a single lead of the plurality of leads, the single lead having an extended portion.

A single layer leadframe can be provided in an electronic package that includes multiple wire bonds to provide high current capacity. Because thinner wires have generally smaller electric current capacity, high electric current connections, including high current surge connections, such as power, ground and some signal pins can be supported with multiple wires. Various systems and techniques are described that allow expanded bond area on a leadframe for multiple wire bonding in a single layer leadframe. This can be accomplished without changing a current footprint for an electronic package.

According to another aspect, a supporting bar of a leadframe can be used as bond area. An electronic package can include a single-layer non-leaded leadframe with support bars on first opposite sides of the electronic package and a plurality of leads electrically isolated from each other and being at least partially exposed at a bottom and second opposite sides of the electronic package providing surface mounting connections. The electronic package further includes a semiconductor chip including signal bond pads and ground bond pads, first wires between the signal bond pads and the plurality of leads, and second wires between the ground bond pads and at least one of the support bars that serves as a common ground.

According to another aspect, a connected lead area can be used for wire bonding. An electronic package can include a leadframe with a plane die paddle, control leads electrically isolated from each other, a voltage output lead having a region with multiple output bonding locations, and a voltage input lead having a region with multiple input bonding locations. The electronic package further includes a semiconductor chip including control bond pads, voltage output bond pads, and voltage input bond pads, the semiconductor chip being mounted on the plane die paddle, where conductors between the voltage output bond pads and the output bonding locations form a lower resistive path than that of conductors between the voltage input bond pads and the voltage input bonding locations.

Details of one or more implementations are set forth in the accompanying drawings and the description below. Other features, objects and advantages may be apparent from the description and drawings, and from the claims.

DRAWING DESCRIPTIONS

Like reference symbols in the various drawings indicate like elements.

DETAILED DESCRIPTION

Figure 1:
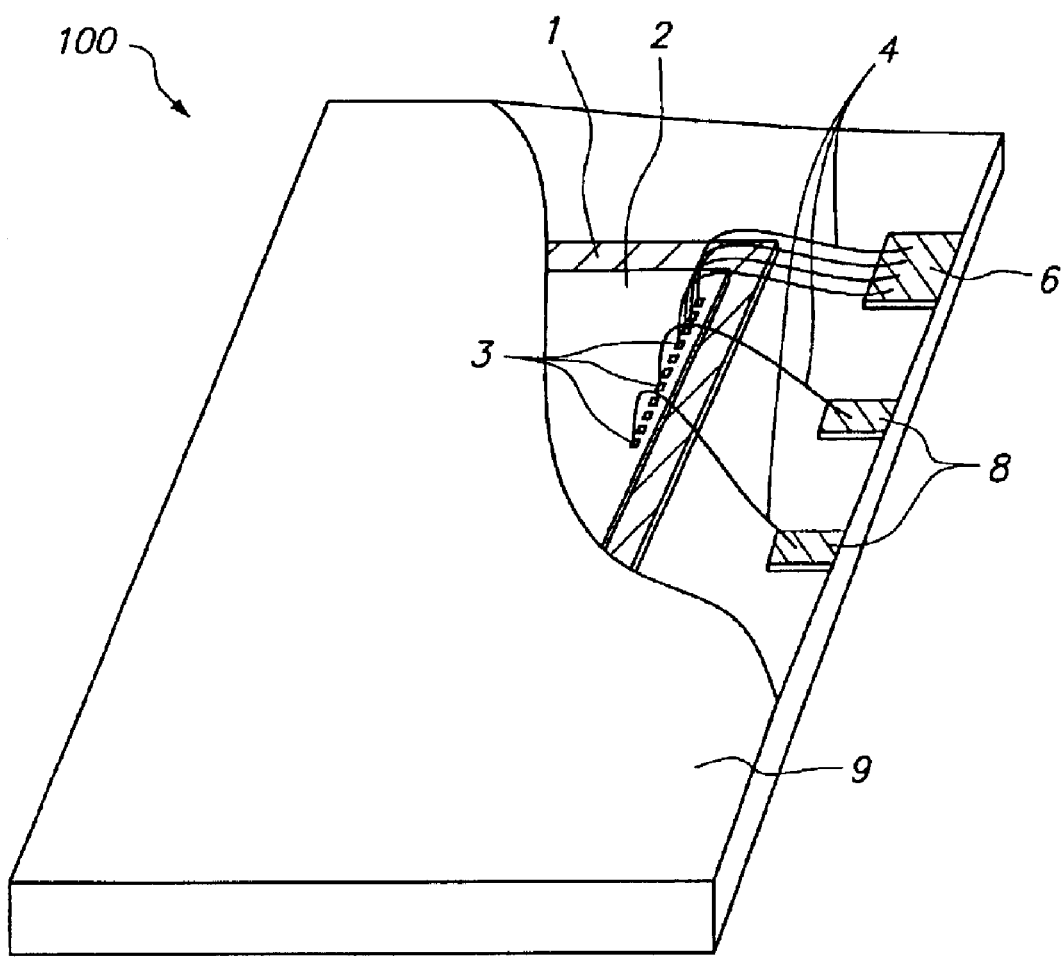
FIG. 1 shows a perspective partially cut-away view of an example electronic package.

FIG. 1 shows a perspective partially cut-away view of an example electronic package 100. The electronic package 100 can be a quad flat non-leaded package encapsulated by a compound 9. The electronic package 100 includes a semiconductor chip 2 mounted on a leadframe paddle 1, such as by using electrical conductive adhesive or film. Bond pads 3 are connected to leadframe leads 6, 8 via wires 4 (e.g., gold wires). The leads 6, 8 can be electrically isolated from each other and partially exposed at a bottom side of the electronic package 100 providing surface mounting connections. Thus, the leads 6, 8 can be connected over a printed circuit board (PCB). The paddle 1 can be exposed on the bottom of the electronic package 100 and used as a common ground pad to connect to a PCB.

The leads 8, with regular lead width for single bond wire, can be bonded with a single gold wire from a die pad to a lead. An extend leaded 6 has extra area for bonding multiple wires. Such extend lead area for bonding can be used for power management and/or can be used for signals with high current surge.

Figure 2A:
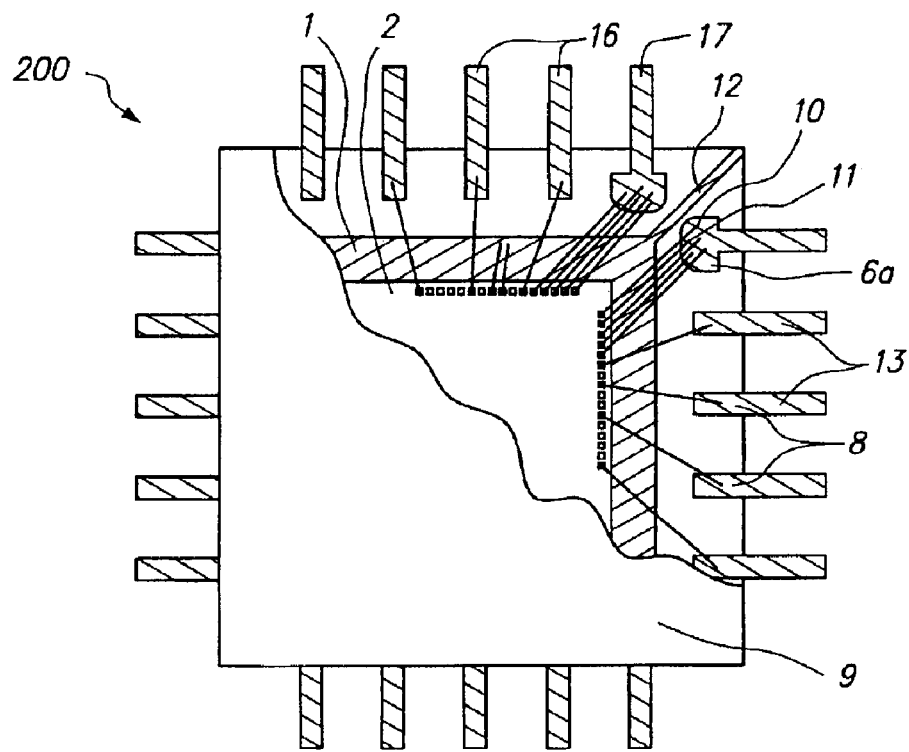
FIG. 2A shows an overhead partially cut-away view of an example leaded package.

FIG. 2A shows an overhead partially cut-away view of an example leaded package 200. The leaded package 200 can be a quad flat package encapsulated by a compound 9 and including a semiconductor chip 2 mounted on a leadframe paddle 1. As this is a leaded package, the leads 8 have inner lead portions for wire bond connects that are encapsulated and not exposed, and outer lead portions 13 that are used as connection leads for connecting to a PCB.

Tie bars 12 (also known as support bars) are used to support the die paddle 1 during the assembly process. An extend bond area 6a on leads, such as a corner lead as shown, allows attachment of multiple bond wires. In order to use the area effectively, the bond locations on an extended area can be staggered between two or more bond locations, such as bond locations 10, 11. The extended area is not exposed, thus the PCB footprint for the package does not change.

Figure 2B:
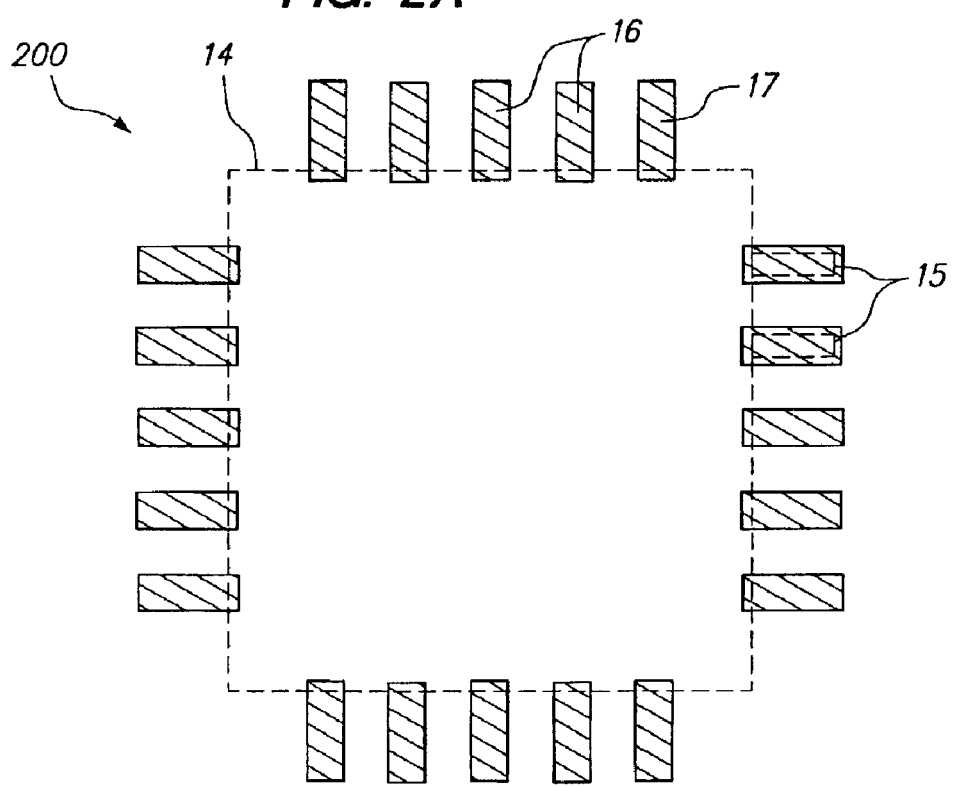
FIG. 2B shows a footprint of the example leaded package of FIG. 2A.

FIG. 2B shows a footprint of the example leaded package 200. As shown, the package body 14 and outer lead area 15 do not change. The footprint area on the regular leads 16 and extended bond area leads 17 remain the same. Thus, existing PCB designs can continue to be used, saving cost and minimizing changes.

Figure 3A:
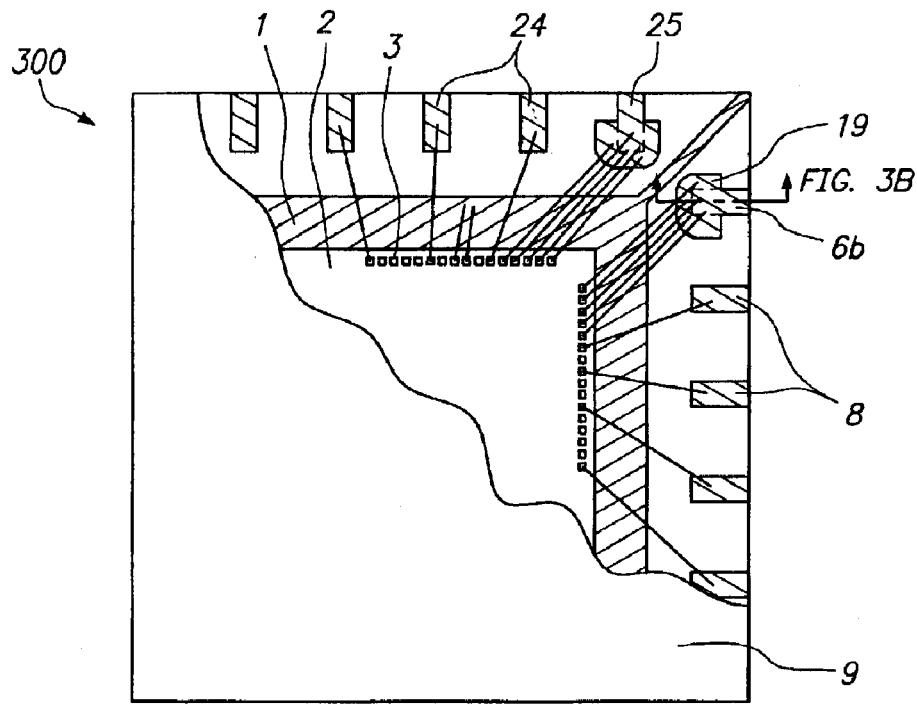
FIG. 3A shows an overhead partially cut-away view of an example non-leaded package.

FIG. 3A shows an overhead partially cut-away view of an example non-leaded package 300. The non-leaded package 300 can be a quad flat non-leaded package encapsulated by a compound 9 and including a semiconductor chip 2 mounted on a plane die paddle 1. The non-leaded package 300 includes a leadframe made from a single layer of an electrically conducting material, such as a copper alloy. The non-leaded package 300 includes leads 6b, 8 that are electrically isolated from each other and partially exposed at a bottom side of the electronic package 300 providing surface mounting connections.

Wires can be connected to an extended lead in a staggered fashion as described above. Thus, a single corner lead can have multiple wires (e.g., at least four wires) connected to an extended portion in a staggered fashion. The extended portion of the lead provides high current capacity through the multiple wires. Because the package 300 is a non-leaded package, the compound 9 can envelope the extended portion of the lead, which is partially exposed at the bottom side of the electronic package 300 providing a non-extended surface mounting connection.

Figure 3B:
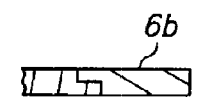
FIG. 3B shows a cross section of an extended lead from FIG. 3A.

An extended lead 6b includes an extended portion 19 providing high current capacity. This extend wire bond area can be half etched to present the same lead size as with regular leads at the bottom of the package 300. The exposed area of the extended lead 6b can have the same size and area as the regular leads 8. FIG. 3B shows a cross section of the extended lead 6b from FIG. 3A. Thus, the extended lead techniques described can be implemented in non-leaded packages and still present the same footprint pattern as traditional non-leaded packages.

Figure 3C:
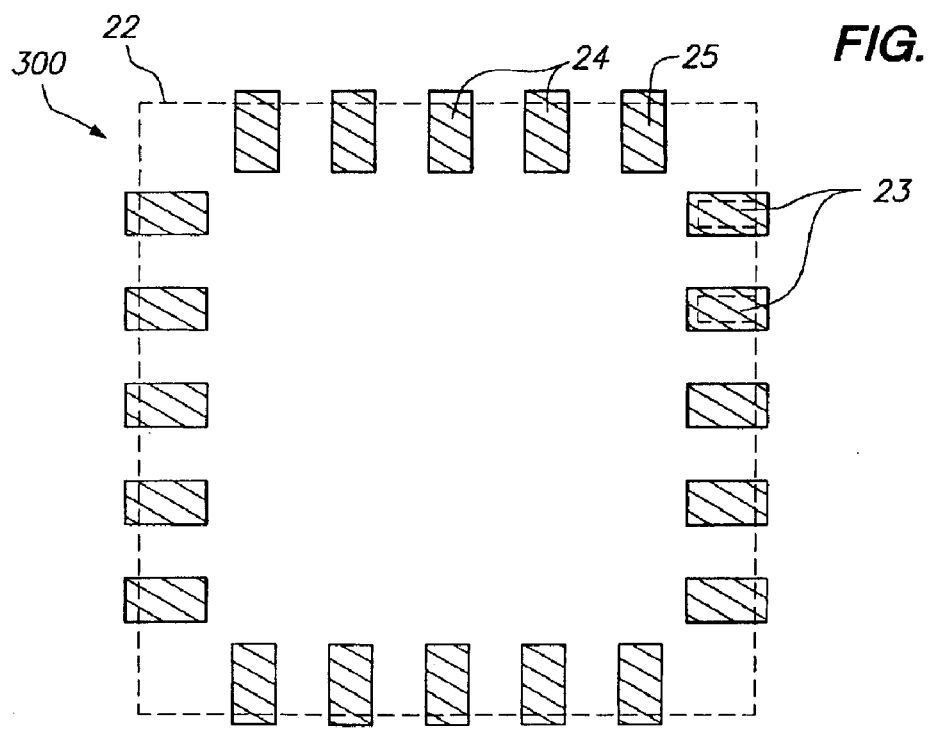
FIG. 3C shows a footprint of the example non-leaded package of FIG. 3A.

FIG. 3C shows a footprint of the example non-leaded package 300. As shown, the package body 22 and exposed lead area 23 do not change. The footprint area on the regular leads 24 and extend bond area leads 25 remain the same. Thus, changes to a regular pitch are avoided and existing PCB designs can continue to be used. A regular pitch can be a pitch that corresponds to a defined semiconductor package connection practice or a product already available at design time, such as a semiconductor package connection standard that is used widely. A non-leaded electronic package using this technique to increase current capacity through a lead can be used with standard tooling in a further manufacturing process, and need not force the use of different, non-standard dimensions between the pins when connecting the package to a PCB.

Figure 4A:
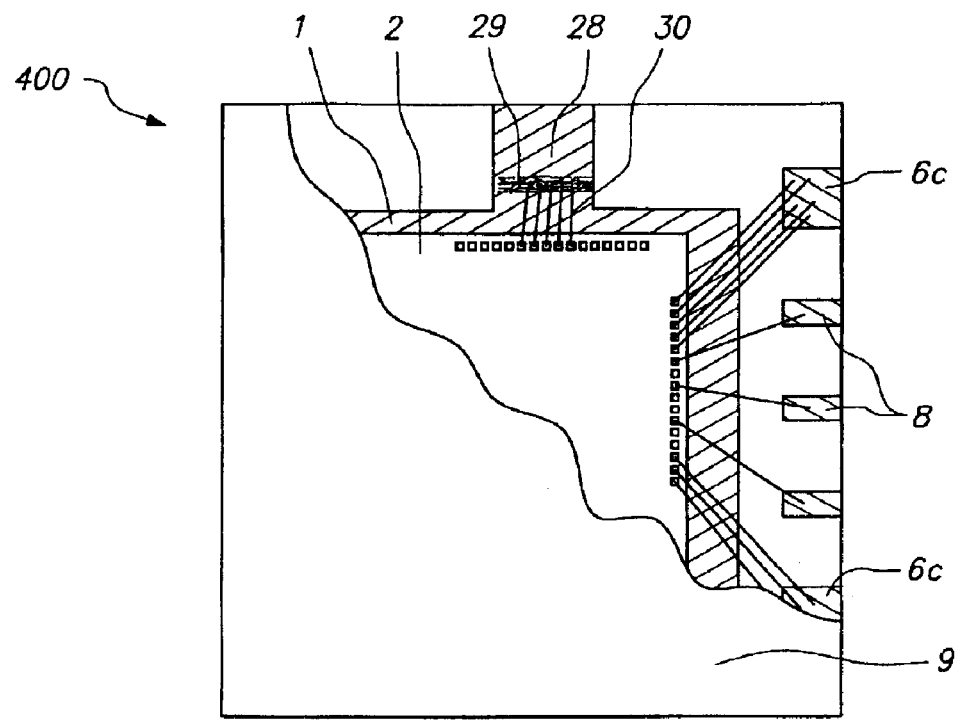
FIG. 4A shows an overhead partially cut-away view of another example non-leaded package.

FIG. 4A shows an overhead partially cut-away view of another example non-leaded package 400. The non-leaded package 400 is a two-directional non-leaded package (i.e., there are leads on only two sides of the package). The non-leaded package 400 can be a non-leaded package encapsulated by a compound 9 and including a semiconductor chip 2 mounted on a plane die paddle 1. The non-leaded package 400 includes a leadframe made from a single layer of an electrically conducting material, such as a copper alloy. The non-leaded package 400 includes leads 8 that are electrically isolated from each other and partially exposed at a bottom side of the electronic package 400 providing surface mounting connections.

Figure 4B:
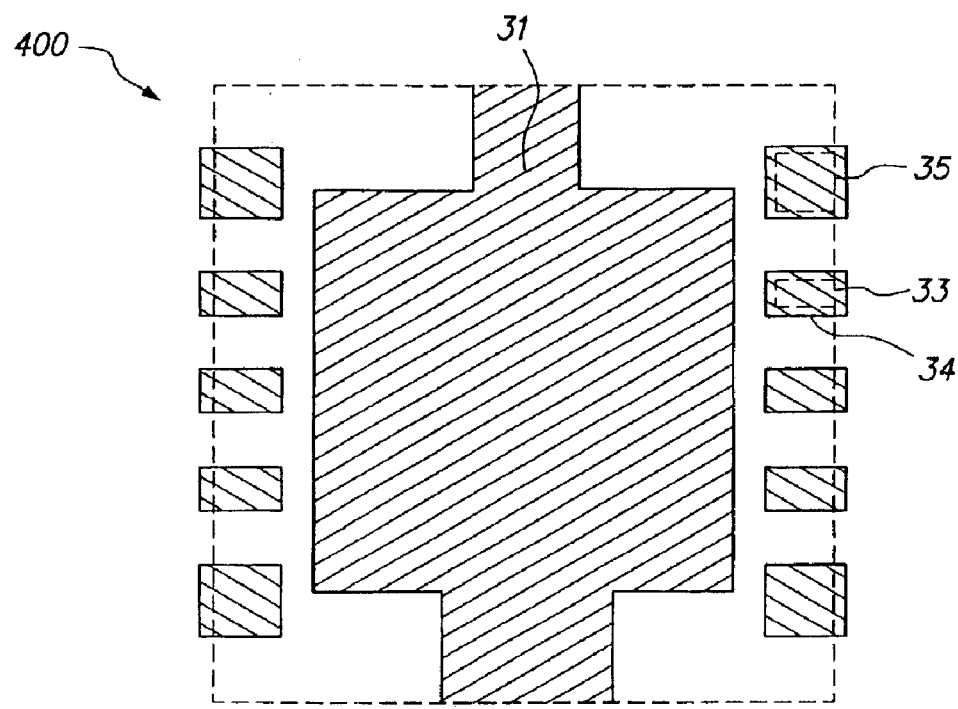
FIG. 4B shows a footprint of the example non-leaded package of FIG. 4A.

Moreover, the non-leaded package 400 can include extended leads 6c that provide high current capacity. Wires can be connected to the extended leads 6c in a staggered fashion as described above. The extended leads 6c may present a different footprint, as shown in FIG. 4B. When placed at corners of the package, the extended leads 6c avoid changes to a regular pitch. The surface mounting connections present a different footprint, but still have a regular pitch, allowing the use of standard tooling.

The non-leaded package 400 includes support bars on first opposite sides of the package, and these support bars can be extended and used as wire bond area. For example, a support bar 28 can have wires 30 connected between ground bond pads and the support bar 28, and the support bar 28 can serve as a common ground. As this is a two-directional package, the ground bond pads can be moved to the support bar sides of the package as shown, thus reducing wire lengths and providing reduced resistance, inductance and heat. This also frees up bond pads on the other two sides for uses other than ground connections and allows an increased die size.

Metal plating 29 can be applied to the tie bars. This can assist in allowing gold wires to be bonded to the support bar area, providing better inter metallic joints.

FIG. 4B shows a footprint of the example non-leaded package 400. If an enlarged lead print is desired to connect to a PCB for thermal and/or electrical purposes, solid extended leads 6c can be used with multiple bond wires as discussed above. As mentioned, this can result in an enlarged foot print pattern 35 different from the footprint 33 for a regular lead 34, but a regular pitch can still be maintained.

The support bars and the plane die paddle can be exposed on the bottom of the electronic package 300 and serve as the common ground. Thus, grounding can be provided through down bonding a large area 31 including the support bars and the plane die paddle.

Figure 5:
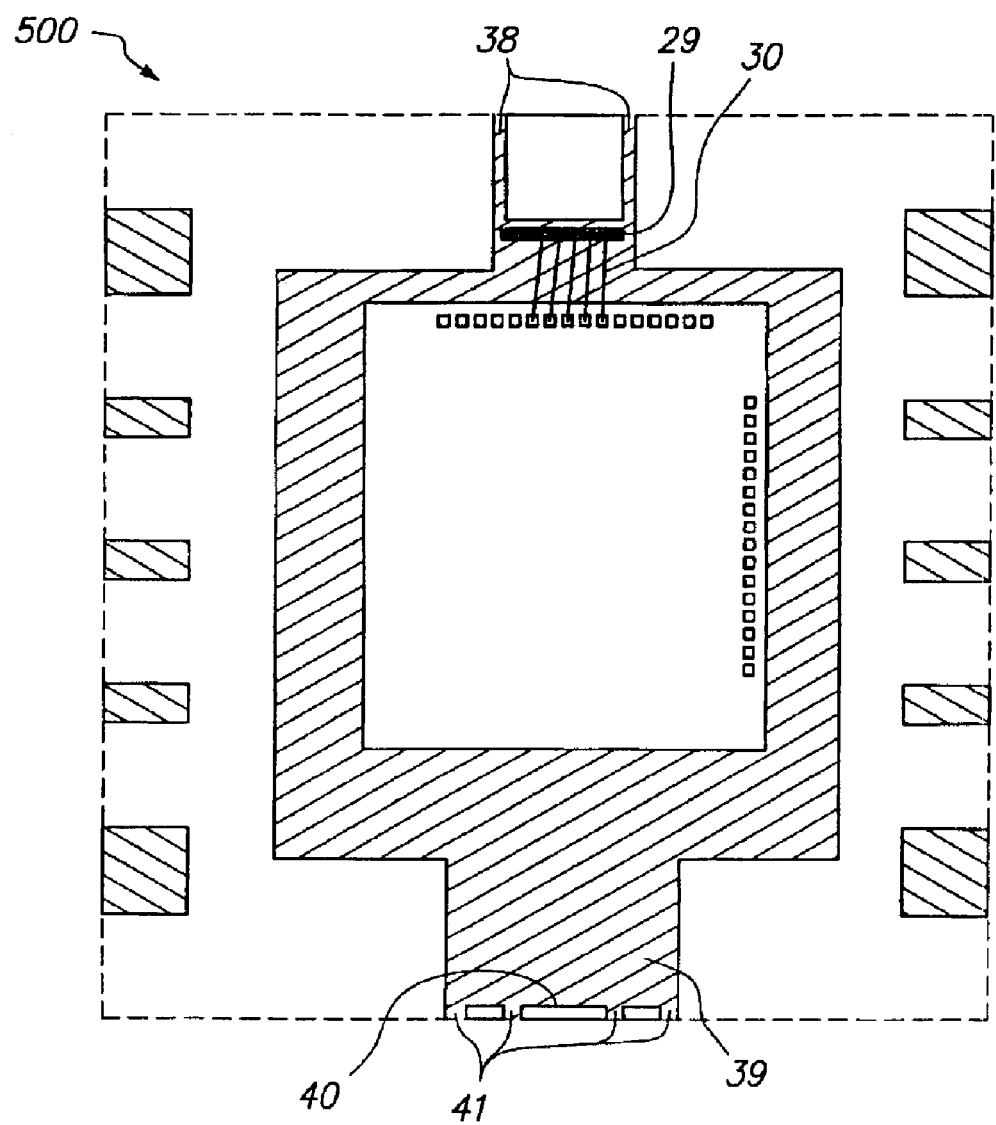
FIG. 5 shows an overhead view of an example electronic package using a tic bar area for wire bonding.

FIG. 5 shows an overhead view of an example electronic package 500 using a tie bar area for wire bonding. The electronic package 500 is the same as the electronic package 400, except that in the assembly process, the package 500 is cingulated either by mechanical sawing or punching. Thus, in FIG. 5, a support bar 38 has wires 30 bonded to the support bar 38 using applied metal plating 29, and the support bars 38, 39 have less area contained in the package edge. The support bars 38, 39 are partially exposed at edges of the electronic package on the first opposite sides. A partially exposed edge of a support bar can have four or more exposed portions 41 at the package edge, and the amount of support bar area provided can be increased, such as by minimal cingulation 40. This can provide better electrical and/or thermal properties when a large extend tie bar area is desired and can also improve the structural integrity of the leadframe.

Figure 6:
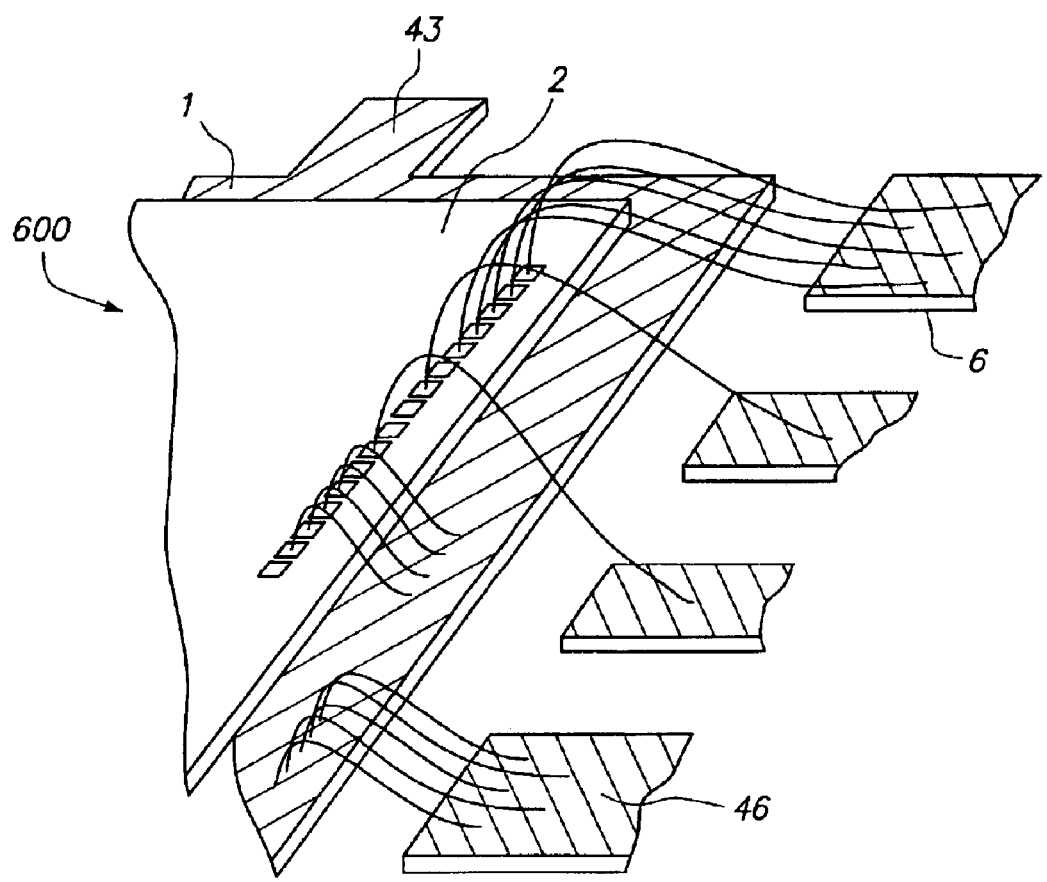
FIG. 6 shows a perspective view of a portion of an example electronic package using multiple wire bonds from die bond pads to leads and leadframe paddle to leads.

FIG. 6 shows a perspective view of a portion of an example electronic package 600 using multiple wire bonds from die bond pads to leads and leadframe paddle to leads. Multiple wires bonded to an extended lead 6 can use staggered bond locations as described previously. The ground pads of the chip 2 can be bonded to a leadframe die paddle 1, which can be used as a common ground connection, including along with a support bar 43 as described above. The die paddle 1 can be connected to a ground lead 46, which can be an extended lead, using multiple wires.

Figure 7:
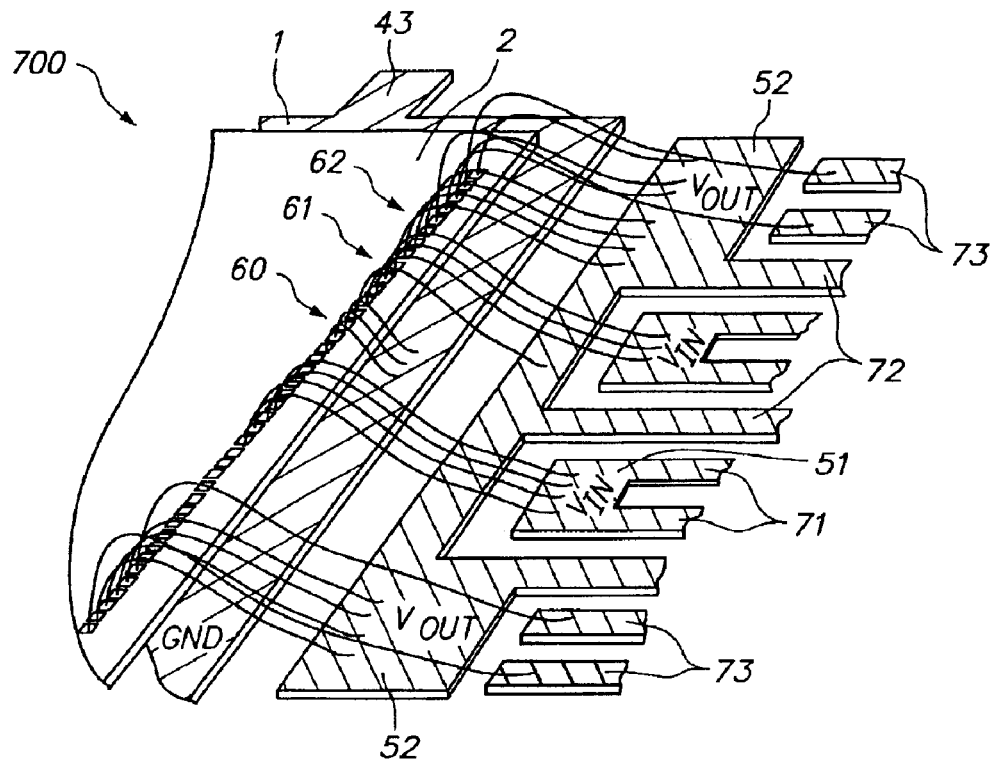
FIG. 7 shows a perspective view of a portion of an example electronic package using an extended bond area to connect multiple leads.

FIG. 7 shows a perspective view of a portion of an example electronic package 700 using an extend bond area to connect multiple leads. The electronic package 700 includes a die paddle 1, which as before, can be used as a common ground connection, including along with a support bar 43. Multiple control leads 73 can be electrically isolated from each other and connected by wires to bond pads on a semiconductor chip 2.

Multiple leads, such as voltage output leads 72 or voltage input leads 71, can be electrically connected together, such as by being fused together. The connected leads can include an extend area or region, such as the region 51 for the voltage input leads 71 and the region 52 for the voltage output leads 72. An extend area can connect two or more leads that are next to each other, such as the voltage input leads 71, or an extend area can connect two or more leads that are separated by other leads, such as the voltage output leads 72. The extend area or region can be used for bonding and to improve thermal performance.

The connected voltage output leads 72, 52 are positioned closer to the plane die paddle 1 than the connected voltage input leads 71, 51 (i.e., the common region for voltage output is closer to the chip 2 than the common region for voltage input). This allows voltage output wires 62 that connect to the voltage output bond pads to be shorter than the voltage input wires 61 that connect to the voltage input bond pads on the semiconductor chip 2. An average length of the voltage output wires 62 can be smaller than an average length of the voltage input wires 61, and an average resistance of the voltage output wires 62 can be lower than an average resistance of the voltage input wires 61. Thus, the general architecture described allows a voltage output resistive path that is lower than a voltage input resistive path to be formed. Providing larger bonding regions for the voltage output wires and the voltage input wires reduces both the bonding resistance and the resistance of the frame.

Additionally, ground wires 60 that are connected to ground bond pads on the semiconductor chip 2 can be shorter than the voltage output wires 62. An average length of the ground wires 60 can be smaller than the average length of the voltage output wires 62. The ground wires 60 can connect to a common ground region exposed on a bottom side of the electronic package. This common ground region can include both the plane die paddle 1 and one or more support bars 43. The region 51 can be smaller than the region 52, which can be smaller than the common ground region. This arrangement of common bonding regions in connection with the voltage output leads and the voltage input leads can result in minimized power dissipation for the electronic package 700, particularly during low duty cycle operation of the semiconductor chip 2. This can result in reduced resistance, reduced inductance, and reduced heat for the electronic package 700, which can be particularly advantageous for high power, high speed applications.

Figure 8:
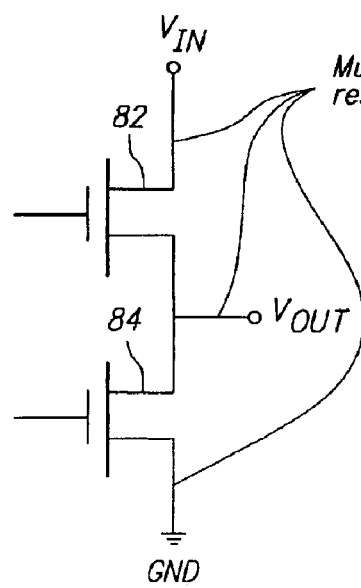
FIG. 8 shows a simple transistor representation of the example electronic package of FIG. 7.

FIG. 8 shows a simple transistor representation of the example electronic package of FIG. 7. Multiple wires are used to connect voltage input leads (V$_{IN}$), voltage output leads (V$_{OUT}$), and ground (GND) to the chip. These connections can support high current flow, and the multiple wires help to keep resistance low, minimizing power dissipation. Additionally, the leadframe topology ensures that the V$_{OUT}$ to GND path 84 has a lower resistance and inductance than the V$_{IN}$ to V$_{OUT}$ path 82.

This leadframe topology can be used to support a voltage regulator, such as in a direct current to direct current (DC-DC) converter. For example, V$_{IN}$ can be in the general range of 5 volts to 3.3 volts, V$_{OUT}$ can be in the general range of 1–8 Volts to 0.8 Volts, thus providing a low duty cycle D, where:

$$D = \frac{V_{out}}{V_{in}}$$

During low duty cycle operation, the upper path 82 is turned on less often than the lower path 84. Thus, this leadframe architecture reduces power dissipation and heat, and renders issues surrounding the duty cycle less significant during design time. This leadframe architecture can become even more useful as the duty cycle decreases. But even when the duty cycle is high, this leadframe architecture can provide benefits because the V$_{OUT}$ to GND path 84 is a wide path with low resistance.

Moreover, the connected voltage output leads can straddle or partially surround the connected voltage input leads such as shown in FIG. 7. The semiconductor chip 2 can be a voltage regulator. The electronic package can include additional features such as described above, including a single layer leadframe and/or a non-leaded package, where the leads are partially exposed at a bottom side of the electronic package providing surface mounting connections.

Figure 9:
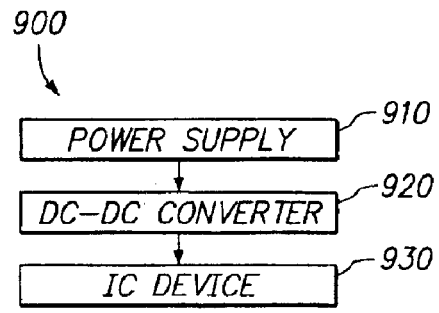
FIG. 9 shows an example system including a direct current to direct current (DC-DC) converter.

FIG. 9 shows an example system 900 including a DC-DC converter 920. The system 900 includes a power supply 910 that provides DC input (VDD). The system 900 also includes an integrated circuit (IC) device such as a central processor. The DC-DC converter 920 provides voltage regulation by duty cycle adjustment, switching the power supply as needed to hold an output voltage constant over a wide range of load variations The DC-DC converter 920 includes an electronic package that uses one or more of the features described above. By combining one or more of the leadframe architectural features described above, high performance can be achieved in a small electronic package.

The system 900 represents general purpose and/or special purpose data processing systems, including personal computers, consumer electronics devices, and/or communications equipment. The DC-DC converter 920 can be a high power, high speed multi-phase or single phase DC-DC converter.

A few embodiments have been described in detail above, and various modifications are possible. Thus, other embodiments may be within the scope of the following claims

What is claimed is:

1. An electronic package comprising:
   a leadframe comprising a single layer of an electrically conducting material, a plane die paddle, and a plurality of leads electrically isolated from each other and partially exposed at a bottom side of the electronic package providing surface mounting connections;
   a semiconductor chip including bond pads, the semiconductor chip being mounted on the plane die paddle; and
   wires between the bond pads and the plurality of leads, including at least two wires between at least two of the bond pads and a single lead of the plurality of leads, wherein the single lead includes an extended portion.

2. The electronic package of claim 1, further comprising a compound enveloping the extended portion of the single lead, which is partially exposed at the bottom aide of the electronic package providing a non-extended surface mounting connection.

3. The electronic package of claim 1, wherein the extended portion comprises a partially etched portion of the single lead.

4. The electronic package of claim 1, wherein the single lead resides at a corner of the electronic package, and the surface mounting connections have a regular pitch.

5. The electronic package of claim 1, wherein the at least two wires comprise two additional wires.

6. The electronic package of claim 5, wherein the at least four wires comprise at least four wires coupled with the extended portion of the single lead in a staggered arrangement.

7. The electronic package of claim 1, wherein the wires comprise gold wires.

8. The electronic package of claim 1, wherein the electrically conducting material comprises a copper alloy.

9. The electronic package of claim 1, wherein the leadframe further comprises support bars on first opposite sides of the electronic package, the bond pads comprise ground bond pads, and the wires comprise grounding wires between the ground bond pads and at least one of the support bars that serves as a common ground.

10. The electronic package of claim 9, wherein the at least one of the support bars includes applied metal plating.

11. The electronic package of claim 9, wherein the support bars and the plane die paddle are exposed on the bottom of the electronic package and serve as the common ground.

12. The electronic package of claim 11, wherein the support bars are partially exposed at edges of the electronic package on the first opposite sides.

13. The electronic package of claim 12, wherein the partially exposed edges of the support bars comprise two or more exposed portions on at least one of the first opposite sides of the electronic package.

14. The electronic package of claim 12, wherein the support bars comprise a minimally cingulated support bar.

15. An electronic package comprising:
   a semiconductor chip including bond pads;
   single-layer non-leaded leadframe means for emplacing and electrically connecting the semiconductor chip, including extended-lead means for providing high current capacity through a single lead to a subset of the bond pads; and
   means for connecting the single-layer non-leaded leadframe means with the bond pads.

16. The electronic package of claim 15, wherein the extended-lead means comprises corner-placed partially-etched lead means for providing high current capacity through the single lead to the subset of the bond pads.

17. The electronic package of claim 15, further comprising staggered wire means for electrically connecting the single lead to the subset of the bond pads.

18. The electronic package of claim 15, wherein the single-layer non-leaded leadframe means further comprises means for both supporting a plane die paddle and grounding ground bond pads.

19. An electronic package comprising:
   a leadframe comprising a single layer of an electrically conducting material, a plane die paddle, support bars on first opposite sides of the electronic package, and a plurality of leads electrically isolated from each other and being at least partially exposed at a bottom and second opposite sides of the electronic package providing surface mounting connections;
   a semiconductor chip including signal bond pads and ground bond pads, the semiconductor chip being mounted on the plane die paddle;
   first wires between the signal bond pads and the plurality of leads; and
   second wires between the ground bond pads and at least one of the support bars that serves as a common ground.

20. The electronic package of claim 19, wherein the at least one of the support bars includes applied metal plating.

21. The electronic package of claim 19, wherein the support bars and the plane die paddle are exposed on the bottom of the electronic package and serve as she common ground.

22. The electronic package of claim 21, wherein the support bars are partially exposed at edges of the electronic package on the first opposite sides.

23. The electronic package of claim 22, wherein the partially exposed edges of the support barn comprise two or more exposed portions on at least one of the first opposite sides of the electronic package.

24. The electronic package of claim 22, wherein the support bars comprise a minimally cingulated support bar.

25. The electronic package of claim 19, wherein the plurality of leads include a single lead having an extended portion, and the first wires include at least two wires between at least two of the signal bond pads and the single lead.

26. The electronic package of claim 25, further comprising a compound enveloping the extended portion of the single lead, which is partially exposed at the bottom side of the electronic package providing a non-extended surface mounting connection.

27. The electronic package of claim 26, wherein the extended portion comprises a partially etched portion of the single lead.

28. The electronic package of claim 26, wherein the single lead resides at a corner of the electronic package, and the surface mounting connections have a regular pitch.

29. The electronic package of claim 26, wherein the at least two wires comprise two additional wires.

30. The electronic package of claim 29, wherein the at least four wires comprise at least four wires coupled with the extended portion of the single lead in a staggered arrangement.

31. The electronic package of claim 19, wherein the first and second wires comprise gold wires.

32. The electronic package of claim 19, wherein the electrically conducting material comprises a copper alloy.

33. The electronic package of claim 19, wherein the plurality of leads comprise control leads electrically isolated from each other, a voltage output lead including a first region with multiple output bonding locations, and a voltage input lead including a second region with multiple input bonding locations, and wherein the signal bond pads comprise voltage output bond pads and voltage input bond pads, and the first wires comprise voltage output wires and voltage input wires, the voltage output wires being between the voltage output bond pads and the output bonding locations, the voltage input wires being between the voltage input bond pads and the input bonding locations, wherein the voltage output wires form a lower resistive path than that of the voltage input wires.

34. The electronic package of claim 19, wherein the plurality of leads comprise control leads electrically isolated from each other, a voltage output lead including a first region with multiple output bonding locations, and a voltage input lead including a second region with multiple input bonding locations, and wherein the signal bond pads comprise control bond pads, voltage output bond pads and voltage input bond pads, and wherein the first wires comprise control wires, voltage output wires and voltage input wires, the control wires being between the control bond pads and the control leads, the voltage output wires being between the voltage output bond pads and the output bonding locations, the voltage input wires being between the voltage input bond pads and the input bonding locations, and an average length of the voltage output wires is less than an average length of the voltage input wires.

35. The electronic package of claim 34, wherein the common ground comprises the support bars and the plane die paddle providing a common ground region exposed on the bottom side of the electronic package, and an average length of the second wires is less than the average length of the voltage output wires, the second region is smaller than the first region, and the first region is smaller than the common ground region.

36. The electronic package of claim 35, wherein the voltage output lead comprises multiple voltage output leads electrically connected together, and the voltage input lead comprises multiple voltage input leads electrically connected together.

37. The electronic package of claim 36, wherein the connected voltage output leads straddle the connected voltage input leads.

38. The electronic package of claim 36, wherein the semiconductor chip comprises a voltage regulator.

39. An electronic package comprising:
a semiconductor chip including ground bond pads;
single-layer non-leaded leadframe means for emplacing and electrically connecting the semiconductor chip, including a plane die paddle and means for both supporting the plane die paddle and grounding the ground bond pads; and
means for connecting the ground bond pads with the means for both supporting the plane die paddle and grounding the ground bond pads.

40. The electronic package of claim 39, wherein the means for both supporting the plane die paddle and grounding the ground bond pads comprises support bars that are partially exposed at edges of the electronic package.

41. The electronic package of claim 40, wherein the semiconductor chip further includes signal bond pads, and the single-layer non-leaded leadframe means further comprises extended-lead means for providing high current capacity through a single lead to a subset of the signal bond pads.

42. The electronic package of claim 41, wherein the extended-lead means comprises corner-placed partially-etched lead means for providing high current capacity through the single lead to the subset of the signal bond pads.

43. The electronic package of claim 41, further comprising staggered wire means for electrically connecting the single lead to the subset of the bond pads.

44. The electronic package of claim 39, wherein the single-layer non-leaded leadframe means further comprises input and output leads arrangement means for minimizing power dissipation during low duty cycle operation of the semiconductor chip.

45. An electronic package comprising:
a leadframe comprising a plane die paddle, control leads electrically isolated from each other, a voltage output lead including a first region with multiple output bonding locations, and a voltage input lead including a second region with multiple input bonding locations;
a semiconductor chip including control bond pads, voltage output bond pads, and voltage input bond pacts, the semiconductor chip being mounted on the plane die paddle;
first conductors between the voltage output bond pads and the output bonding locations; and
second conductors between the voltage input bond pads and the input bonding locations, wherein the first conductors form a lower resistive path than that of the second conductors.

46. The electronic package of claim 45, wherein the first conductors comprise voltage output wires, and the second conductors comprise voltage input wires.

47. An electronic package comprising:
a leadframe comprising a plane die paddle, control leads electrically isolated from each other, a voltage output lead including a first region with multiple output bonding locations, and a voltage input lead including a second region with multiple input bonding locations;
a semiconductor chip including control bond pads, voltage output bond pads, and voltage input bond pads, the semiconductor chip being mounted on the plane die paddle;
voltage output wires between the voltage output bond pads and the output bonding locations; and voltage input wires between the voltage input bond pads and the input bonding locations, wherein an average length of the voltage output wires is less than an average length of the voltage input wires.

48. The electronic package of claim 47, wherein the semiconductor chip includes ground bond pads, the package further comprising ground wires between the ground bond pads and a common ground region exposed on a bottom side of the electronic package, wherein the common ground region includes the plane die paddle, an average length of the ground wires is less than the average length of the voltage output wires, the second region is smaller than the first region, and the first region is smaller than the common ground region.

49. The electronic package of claim 48, wherein the voltage output lead comprises multiple voltage output leads electrically connected together, and the voltage input lead comprises multiple voltage input leads electrically connected together.

50. The electronic package of claim 49, wherein the connected voltage output leads straddle the connected voltage input leads.

51. The electronic package of claim 49, wherein the semiconductor chip comprises a voltage regulator.

52. The electronic package of claim 49, wherein the leadframe comprises a single layer of an electrically conducting material.

53. The electronic package of claim 52, wherein the leads are partially exposed at a bottom side of the electronic package providing surface mounting connections.

54. The electronic package of claim 53, wherein the leadframe further comprises support bare on first opposite sides of the electronic package, and the ground wires connect the ground bond pads to at least one of the support bars that serves as at least a portion of the common ground region.

55. The electronic package of claim 54, wherein the at least one of the support bars includes applied metal plating.

56. The electronic package of claim 54, wherein the plane die paddle and the support bars serve as the common ground region.

57. The electronic package of claim 56, wherein the support bars are partially exposed at edges of the electronic package on the first opposite sides.

58. The electronic package of claim 57, wherein the partially exposed edges of the support bars comprise two or more exposed portions on at least one of the first opposite sides of the electronic package.

59. The electronic package of claim 57, wherein the support bars comprise a minimally cingulated support bar.

60. The electronic package of claim 52, wherein the electrically conducting material comprises a copper alloy.

61. The electronic package of claim 47, wherein the wires comprise gold wires.

62. An electronic package comprising:
a semiconductor chip;
leadframe means for emplacing and electrically connecting the semiconductor chip, including voltage input and output leads arrangement means for minimizing power dissipation during low duty cycle operation of the semiconductor chip; and
means for connecting the voltage input and output leads arrangement means with the semiconductor chip.

63. The electronic package of claim 62, wherein the voltage input and output leads arrangement means comprise connected voltage output leads that straddle connected voltage input leads.

64. The electronic package of claim 62, wherein the leadframe means comprises means for both supporting a plane die paddle and grounding ground bond pads on the semiconductor chip.

65. The electronic package of claim 62, wherein the semiconductor chip comprises a voltage regulator.

66. A system comprising:
a power supply;
a direct current to direct current (DC-DC) converter coupled with the power supply, the DC-DC converter providing voltage regulation by duty cycle adjustment and including an electronic package comprising
a leadframe comprising a plane die paddle, control leads electrically isolated from each other, a voltage output lead including a first region with multiple output bonding locations, and a voltage input lead including a second region with multiple bonding locations,
a semiconductor chip including control bond pads, voltage output bond pads, and voltage input bond pads, the semiconductor chip being mounted on the plane die paddle,
first conductors between the voltage output bond pads and the output bonding locations, and
second conductors between the voltage input bond pads and the input bonding locations, wherein the first conductors form a lower resistive path than that of the second conductors; and
an integrated circuit device coupled with the DC-DC converter.

67. The system of claim 66, wherein the first conductors comprise voltage output wires, and the second conductors comprise voltage input wires.

68. A system comprising:
a power supply;
a direct current to direct current (DC-DC) converter coupled with the power supply, the DC-DC converter providing voltage regulation by duty cycle adjustment and including an electronic package comprising
a leadframe comprising a plane die paddle, control leads electrically isolated from each other, a voltage output lead including a first region with multiple output bonding locations, and a voltage input lead including a second region with multiple bonding locations,
a semiconductor chip including control bond pads, voltage output bond pads, and voltage input bond pads, the semiconductor chip being mounted on the plane die paddle,
voltage output wires between the voltage output bond pads and the output bonding locations, and
voltage input wires between the voltage input bond pads and the input bonding locations, wherein an average length of the voltage output wires is less than an average length of the voltage input wires; and
an integrated circuit device coupled with the DC-DC converter.

69. The system of claim 68, wherein the semiconductor chip includes ground bond pads, the package further comprising ground wires between the ground bond pads and a common ground region exposed on a bottom side of the electronic package, wherein the common ground region includes the plane die paddle, an average length of the ground wires is less than the average length of the voltage output wires, the second region is smaller than the first region, and the first region is smaller than the common ground region.

70. The system of claim 69, wherein the voltage output lead comprises multiple voltage output leads electrically connected together, and the voltage input lead comprises multiple voltage input leads electrically connected together.

71. The system of claim 70, wherein the connected voltage output leads straddle the connected voltage input leads.

72. The system of claim 70, wherein the semiconductor chip comprises a voltage regulator.

73. The system of claim 70, wherein the leadframe comprises a single layer of an electrically conducting material.

74. The system of claim 73, wherein the leads are partially exposed at a bottom side of the electronic package providing surface mounting connections.

75. The system of claim 74, wherein the leadframe further comprises support bars on first opposite sides of the electronic package, and the ground wires connect the ground bond pads to at least one of the support bars that serves as at least a portion of the common ground region.

76. The system of claim 75, wherein the at least one of the support bars includes applied metal plating.

77. The system of claim 75, wherein the plane die paddle and the support bars serve as the common ground region.

78. The system of claim 77, wherein the support bars are partially exposed at edges of the electronic package on the first opposite sides.

79. The system of claim 78, wherein the partially exposed edges of the support bars comprise two or more exposed portions on at least one of the first opposite sides of the electronic package.

80. The system of claim 78, wherein the support bars comprise a minimally cingulated support bar.

81. The system of claim 73, wherein the electrically conducting material comprises a copper alloy.

82. The system of claim 68, wherein the wires comprise gold wires.

83. The system of claim 68, wherein the integrated circuit device comprises a central processor.

84. The system of claim 68, wherein the power supply comprises a battery.

85. A system comprising:

a power supply;

a direct current to direct current (DC-DC) converter coupled with the power supply, the DC-DC converter providing voltage regulation by duty cycle adjustment and including an electronic package comprising a semiconductor chip, leadframe means for emplacing and electrically connecting the semiconductor chip, including voltage input and output leads arrangement means for minimizing power dissipation during low duty cycle operation of the semiconductor chip, and means for connecting the voltage input and output leads arrangement means with the semiconductor chip; and an integrated circuit device coupled with the DC-DC converter.

86. The system of claim 85, wherein the voltage input and output leads arrangement means comprises connected voltage output leads that straddle connected voltage input leads.

87. The system of claim 85, wherein the leadframe means comprises means for both supporting a plane die paddle and grounding ground bond pads on the semiconductor chip.

88. The system of claim 85, wherein the semiconductor chip comprises a voltage regulator.

89. The system of claim 85, wherein the integrated circuit device comprises a central processor.

90. The system of claim 85, wherein the power supply comprises a battery.

* * * * *